United States Patent
Chin et al.

(10) Patent No.: US 11,049,936 B2
(45) Date of Patent: Jun. 29, 2021

(54) HIGH RUGGEDNESS HETEROJUNCTION BIPOLAR TRANSISTOR STRUCTURE

(71) Applicant: VISUAL PHOTONICS EPITAXY CO., LTD., Taoyuan (TW)

(72) Inventors: Yu-Chung Chin, Taoyuan (TW); Chao-Hsing Huang, Taoyuan (TW); Min-Nan Tseng, New Taipei (TW); Kai-Yu Chen, Taoyuan (TW)

(73) Assignee: VISUAL PHOTONICS EPITAXY CO., LTD., Taoyuan (TW)

( * ) Notice: Subject to any disclaimer, the term of this patent is extended or adjusted under 35 U.S.C. 154(b) by 62 days.

(21) Appl. No.: 16/292,365

(22) Filed: Mar. 5, 2019

(65) Prior Publication Data
US 2020/0161421 A1 May 21, 2020

(30) Foreign Application Priority Data
Nov. 20, 2018 (TW) .................... 107141339

(51) Int. Cl.
*H01L 33/00* (2010.01)
*H01L 21/00* (2006.01)
(Continued)

(52) U.S. Cl.
CPC ...... *H01L 29/0817* (2013.01); *H01L 27/0823* (2013.01); *H01L 29/0804* (2013.01);
(Continued)

(58) Field of Classification Search
CPC .............. H01L 29/7375; H01L 29/0817; H01L 29/205; H01L 29/7371; H01L 33/0025;
(Continued)

(56) References Cited

U.S. PATENT DOCUMENTS 6,611,008 B2 *  8/2003  Twynam ............. H01L 29/0817
                                                   257/197
7,812,249 B2    10/2010 King et al.
(Continued)

FOREIGN PATENT DOCUMENTS

JP        2007-335586        12/2007

*Primary Examiner* — Alonzo Chambliss
(74) *Attorney, Agent, or Firm* — Amin, Turocy & Watson, LLP

(57) ABSTRACT

The disclosure provides a high ruggedness HBT structure, including: a sub-collector layer on a substrate and formed of an N-type III-V semiconductor material; a collector layer on the sub-collector layer and formed of a III-V semiconductor material; a base layer on the collector layer and formed of a P-type III-V semiconductor material; an emitter layer on the base layer and formed of one of N-type semiconductor materials of InGaP, InGaAsP and InAlGaP; a first emitter cap layer on the emitter layer and formed of one of undoped or N-type semiconductor materials of $Al_xGa_{1-x}As$, $Al_xGa_{1-x}As_{1-y}N_y$, $Al_xGa_{1-x}As_{1-z}P_z$, $Al_xGa_{1-x}As_{1-w}Sb_w$, and $In_rAl_xGa_{1-x-r}As$, x having a highest value between $0.05 \leq x \leq 0.4$, and y, z, r, w$\leq 0.1$; a second emitter cap layer on the first emitter cap layer and formed of an N-type III-V semiconductor material; and an ohmic contact layer on the second emitter cap layer and formed of an N-type III-V semiconductor material.

19 Claims, 8 Drawing Sheets

(51) Int. Cl.
*H01L 29/08* (2006.01)
*H01L 29/205* (2006.01)
*H01L 29/737* (2006.01)
*H01L 27/082* (2006.01)
*H01L 29/732* (2006.01)

(52) U.S. Cl.
CPC ........ *H01L 29/0821* (2013.01); *H01L 29/205* (2013.01); *H01L 29/732* (2013.01); *H01L 29/7371* (2013.01); *H01L 29/7375* (2013.01); *H01L 33/0025* (2013.01)

(58) Field of Classification Search
CPC ............. H01L 29/7785; H01L 29/0804; H01L 29/0821; H01L 27/0823; H01L 29/732; H01L 2924/13051
See application file for complete search history.

(56) References Cited

U.S. PATENT DOCUMENTS

| | | | |
|---|---|---|---|
| 8,120,147 B1 | 2/2012 | Sugg | |
| 9,905,678 B2* | 2/2018 | Zampardi | ........... H01L 21/8252 |
| 10,418,468 B2* | 9/2019 | Zampardi | ......... H01L 29/66318 |
| 10,629,711 B2* | 4/2020 | Zampardi | ......... H01L 29/41708 |
| 10,651,298 B2* | 5/2020 | Chin | .................. H01L 29/0821 |
| 2004/0195588 A1 | 10/2004 | Hase | |
| 2007/0023783 A1* | 2/2007 | Hase | ................... H01L 29/7371 257/197 |
| 2012/0293813 A1* | 11/2012 | Rehder | .................. H01L 22/12 356/630 |
| 2015/0255585 A1* | 9/2015 | Chin | .................. H01L 29/0821 257/76 |
| 2017/0236925 A1* | 8/2017 | Zampardi | ........... H01L 29/0817 257/197 |
| 2018/0190801 A1* | 7/2018 | Zampardi | ........... H01L 29/0817 |
| 2019/0341477 A1* | 11/2019 | Zampardi | ......... H01L 29/41708 |

* cited by examiner

HIGH RUGGEDNESS HETEROJUNCTION BIPOLAR TRANSISTOR STRUCTURE

CROSS-REFERENCE TO RELATED APPLICATION

This application claims the priority of Taiwanese patent application No. 107141339, filed on Nov. 20, 2018, which is incorporated herewith by reference.

BACKGROUND OF THE INVENTION

1. Field of the Invention

The technical field generally relates to a high ruggedness heterojunction bipolar transistor structure, in particular, to adding a first emitter cap layer containing Al over the emitter layer of the heterojunction bipolar transistor; the first emitter cap layer being formed of at least one of undoped or N-type semiconductor materials of $Al_xGa_{1-x}As$, $Al_xGa_{1-x}As_{1-y}N_y$, $Al_xGa_{1-x}As_{1-z}P_z$, $Al_xGa_{1-x}As_{1-w}Sb_w$, and $In_rAl_xGa_{1-x-r}As$, x having a highest value between $0.05 \le x \le 0.4$, and y, z, r, w $\le 0.1$.

2. The Prior Arts

The heterojunction bipolar transistors (HBTs) use different semiconductor materials to form the emitter and the base layers, and form a heterojunction at the junction of the emitter and the base. The advantage is that the emitter injection efficiency increases because the hole flowing from the base to the emitter is more difficult to cross the valence band discontinuity (ΔEv) between the base and the emitter, especially when the emitter is made of InGaP, InGaAsP or InAlGaP, and the valence band hole barrier of the emitter and the base is particularly large. As a result, the HBT can maintain high current gain and improve high frequency response with high base doping concentration. When the HBT is used as a power amplifier (PA) for a handheld device, the power added efficiency (PAE) is particularly important. On the HBT device, in addition to improving the PAE by adjusting the HBT epitaxial layer structure, the operating voltage or current modification of the PA by circuit design can also effectively improve the PAE. However, when the HBT operates at a high voltage or a high current, the HBT is prone to damage due to excessive power. For example, the excessive power rebounded back when the PA is not in the impedance match condition and causes the ruggedness issue of the PA. Therefore, how to effectively improve the ruggedness of an HBT under high voltage or high current (i.e., high power density) operation is an important topic.

FIG. 1 is a schematic view of an HBT structure in a prior art, which shows that a sub-collector layer 20, a collector layer 30, a base layer 40, an emitter layer 50, an emitter cap layer 60 and an ohmic contact layer 70 are sequentially stacked on a substrate 10 from bottom to top in the HBT structure 1. In general, the emitter layer 50 is formed of InGaP and the emitter cap layer 60 is formed of GaAs, and there is a large conduction band discontinuity (ΔEc) at the junction of the two layers, thereby a large electron potential barrier is formed. Then, as shown in FIG. 3, when electrons flow from the emitter cap layer 60 to the emitter layer 50, the potential barrier of the conduction band blocks the electrons flow, thereby causing a large emitter resistance (Re). To reduce the emitter resistance, a highly doped N-type GaAs is generally used in the emitter cap layer 60. However, when a highly doped emitter cap layer 60 is used, the breakdown voltage (BVebo) of the emitter-base junction is lowered and the emitter-base junction capacitance (Cbe) is increased, thereby having negative impacts on the HBT ruggedness and high frequency response (RF) characteristics. In this regard, to increase the breakdown voltage of the emitter-base junction and reduce the emitter-base junction capacitance, usually increasing the emitter layer 50 thickness is the most effective way. However, this way causes not only the difficulty of the HBT device process, but also the higher emitter resistance, thereby affecting the RF characteristics of the HBT.

SUMMARY OF THE INVENTION

Based on the above technical issues, the present invention provides a high ruggedness heterojunction bipolar transistor structure. In addition to effectively increasing the breakdown voltage of the emitter-base junction and reducing the emitter-base junction capacitance without increasing or with slightly increasing the emitter resistance, the structure can also use the aluminum-containing (Al) semiconductor material such as AlGaAs, which has a high bandgap and the resistivity rises rapidly with temperature, especially at a high temperature, to improve the ruggedness of the PA during very high power density operation. In general, there is a trade-off between PA ruggedness and RF characteristics (PAE, linearity . . . etc). The efficiency and linearity of the PA can be enhanced by sacrificing PA ruggedness in this invention through changing the HBT design. Therefore, this invention can improve over all performance of HBT PA and have more design flexibility.

The purpose of the present invention is to provide a high ruggedness heterojunction bipolar transistor structure, comprising: a sub-collector layer stacked on a substrate and formed of an N-type III-V semiconductor material; a collector layer stacked on the sub-collector layer and formed of a III-V semiconductor material; a base layer stacked on the collector layer and formed of a P-type III-V semiconductor material; an emitter layer stacked on the base layer and formed of at least one of N-type semiconductor materials of InGaP, InGaAsP and InAlGaP; a first emitter cap layer stacked on the emitter layer and formed of at least one of undoped or N-type semiconductor materials of $Al_xGa_{1-x}As$, $Al_xGa_{1-x}As_{1-y}N_y$, $Al_xGa_{1-x}As_{1-z}P_z$, $Al_xGa_{1-x}As_{1-w}Sb_w$, and $In_rAl_xGa_{1-x-r}As$, x having a highest value between $0.05 \le x \le 0.4$, and y, z, r, w $\le 0.1$; a second emitter cap layer stacked on the first emitter cap layer and formed of an N-type III-V semiconductor material; and an ohmic contact layer stacked on the second emitter cap layer and formed of an N-type III-V semiconductor material, wherein in a direction from the second emitter cap layer to the emitter layer, the bandgap of the first emitter cap layer comprising at least one of gradually-increasing bandgap and constant bandgap.

Preferably, in an embodiment of the invention, the first emitter cap layer comprises at least a uniform layer with constant bandgap.

Preferably, in an embodiment of the invention, the first emitter cap layer comprises at least a graded layer, and in the direction from the second emitter cap layer to the emitter layer, bandgap of the graded layer is gradually increasing.

Preferably, in an embodiment of the invention, the first emitter cap layer comprises at least a combination of a uniform layer and a graded layer, and in the direction from the second emitter cap layer to the emitter layer, bandgap of the graded layer is gradually increasing.

Preferably, in an embodiment of the invention, the first emitter cap layer has a thickness of 1 nm to 300 nm and an N-type doping concentration of $1\times10^{16}/cm^3$ to $5\times10^{18}/cm^3$.

Preferably, in an embodiment of the invention, by photoluminescence (PL) spectrum of the emitter material, the photoluminescence peak wavelength of InGaP is 694 nm or less, and the photoluminescence peak wavelength of InGaAsP is 710 nm or less, and the photoluminescence peak wavelength of InAlGaP is 685 nm or less.

Preferably, in an embodiment of the present invention, by photoluminescence (PL) spectrum of the emitter material, the photoluminescence peak wavelength of InGaP is 685 nm or less, and the photoluminescence peak wavelength of InGaAsP is 695 nm or less, and the photoluminescence peak wavelength of InAlGaP is 675 nm or less.

Preferably, in an embodiment of the present invention, by photoluminescence (PL) spectrum of the emitter material, the photoluminescence peak wavelength of InGaP is 675 nm or less, and the photoluminescence peak wavelength of InGaAsP is 685 nm or less, and the photoluminescence peak wavelength of InAlGaP is 665 nm or less.

Preferably, in an embodiment of the invention, an intermediate composite layer is further formed between the substrate and the sub-collector layer and formed of a semiconductor material.

Preferably, in an embodiment of the invention, the intermediate composite layer comprises at least a buffer layer, and the buffer layer is formed of a III-V semiconductor material.

Preferably, in an embodiment of the invention, the intermediate composite layer comprises a field effect transistor.

Preferably, in an embodiment of the invention, the intermediate composite layer comprises a pseudomorphic high electron mobility transistor, which is sequentially stacked on the substrate, comprising: at least a buffer layer, a first donor layer, a first spacer layer, a channel layer, a second spacer layer, a second donor layer, a Schottky layer, an etch stop layer, and a cap layer for ohmic contact; the buffer layer is formed of a III-V semiconductor material, the first donor layer and the second donor layer are formed of at least one of N-type semiconductor materials of GaAs, AlGaAs, InAlGaP, InGaP, and InGaAsP, the first spacer layer and the second spacer layer are formed of at least one of semiconductor materials of GaAs, AlGaAs, InAlGaP, InGaP, and InGaAsP, the channel layer is formed of at least one of semiconductor materials of GaAs, InGaAs, AlGaAs, InAlGaP, InGaP, and InGaAsP, the Schottky layer is formed of at least one of semiconductor materials of GaAs, AlGaAs, InAlGaP, InGaP, and InGaAsP, the etch stop layer is formed of at least one of semiconductor materials of GaAs, AlGaAs, InAlGaP, InGaAsP, InGaP, and AlAs, and the cap layer is formed of an N-type III-V semiconductor material.

Preferably, in an embodiment of the invention, a spacer layer is further formed between the first emitter cap layer and the emitter layer and formed of an N-type or undoped III-V semiconductor material.

Preferably, in an embodiment of the invention, the spacer layer has a thickness of 0.2 nm to 200 nm and an N-type doping concentration of $1\times10^{16}/cm^3$ to $5\times10^{18}/cm^3$.

Preferably, in an embodiment of the invention, the spacer layer is formed of at least one of N-type or undoped semiconductor materials of AlGaAs, AlGaAsN, AlGaAsP, AlGaAsSb, InAlGaAs, InGaP, InGaAsP, InAlGaP, and GaAs.

Preferably, in an embodiment of the invention, the bandgap of the spacer layer comprises at least one of gradually-increasing bandgap, constant bandgap and gradually-decreasing bandgap.

The foregoing will become better understood from a careful reading of a detailed description provided herein below with appropriate reference to the accompanying drawings.

BRIEF DESCRIPTION OF THE DRAWINGS

The embodiments can be understood in more detail by reading the subsequent detailed description in conjunction with the examples and references made to the accompanying drawings, wherein.

DETAILED DESCRIPTION OF THE DISCLOSED EMBODIMENTS

Figure 1:
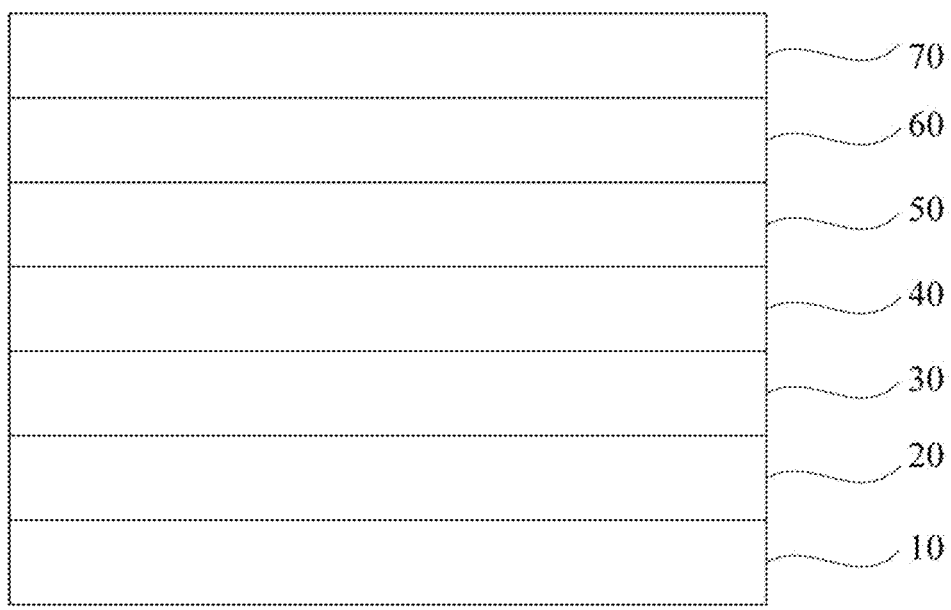
FIG. 1 shows a schematic view of an HBT structure in the prior art.

In the following detailed description, for purpose of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
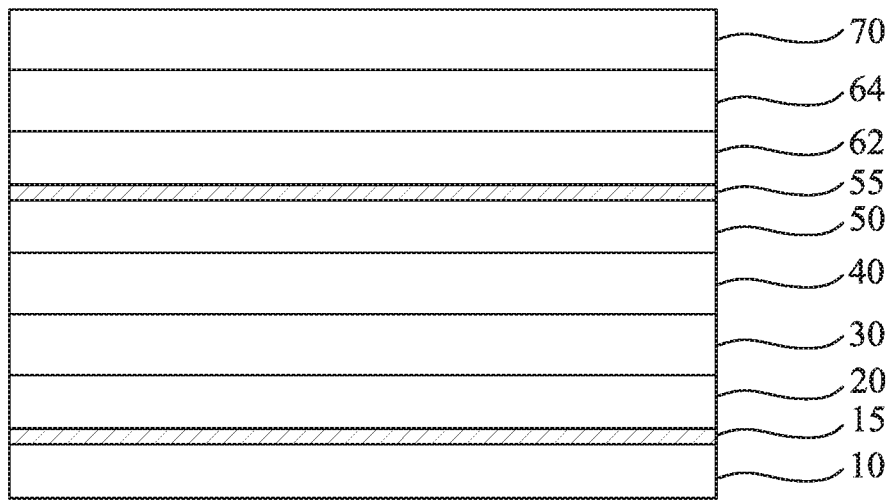
FIG. 2 shows a schematic view of a high ruggedness HBT structure in accordance with an embodiment of the present invention.
Figure 3:
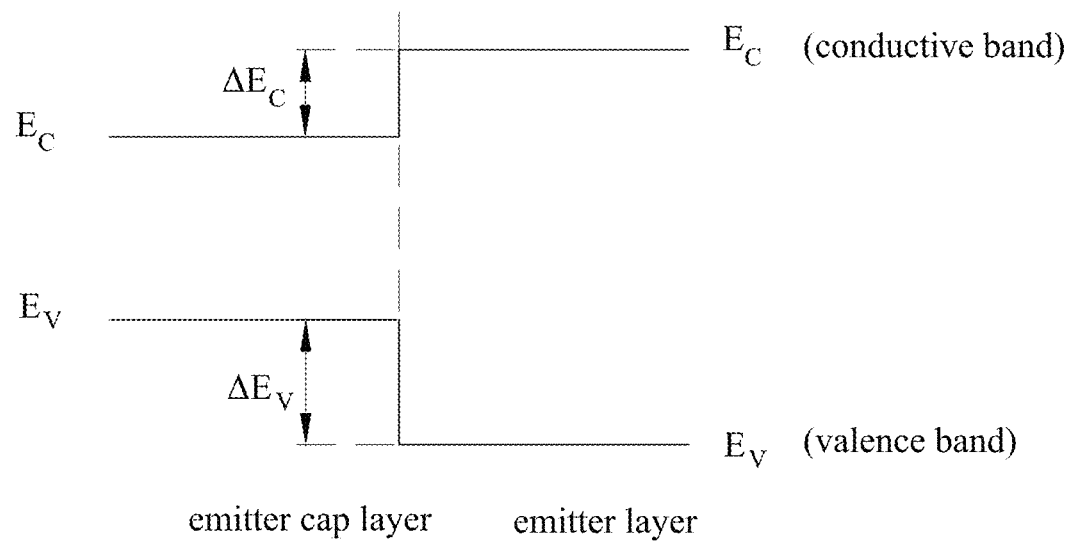
FIG. 3 shows a schematic view of the energy band diagram between an emitter cap layer and an emitter layer in the prior art.

FIG. 2 shows a schematic view of a high ruggedness heterojunction bipolar transistor (HBT) structure in accordance with an exemplary embodiment of the present invention. As shown in FIG. 2, the HBT structure 2 comprises: a substrate 10, a sub-collector layer 20, a collector layer 30, a base layer 40, an emitter layer 50, a first emitter cap layer 62, a second emitter cap layer 64 and an ohmic contact layer 70.

In the HBT structure 2, the sub-collector layer 20 is stacked on the substrate 10 and formed of an N-type III-V semiconductor material; the collector layer 30 is stacked on the sub-collector layer 20 and formed of a III-V semiconductor material; the base layer 40 is stacked on the collector layer 30 and formed of a P-type III-V semiconductor material; the emitter layer 50 is stacked on the base layer 40 and formed of at least one of N-type semiconductor materials of InGaP, InGaAsP and InAlGaP; the first emitter cap layer 62 is stacked on the emitter layer 50 and formed of at least one of undoped or N-type semiconductor materials of $Al_xGa_{1-x}As$, $Al_xGa_{1-x}As_{1-y}N_y$, $Al_xGa_{1-x}As_{1-z}P_z$, $Al_xGa_{1-x}As_{1-w}Sb_w$, and $In_rAl_xGa_{1-x-r}As$, x having a highest value between $0.05 \leq x \leq 0.4$, and y, z, r, $w \leq 0.1$; the second emitter cap layer 64 is stacked on the first emitter cap layer 62 and formed of an N-type III-V semiconductor material; and the ohmic contact layer 70 is stacked on the second emitter cap layer 64 and formed of an N-type III-V semiconductor material.

Wherein the material for the sub-collector layer 20, the collector layer 30, the base layer 40, the second emitter cap layer 64, and the ohmic contact layer 70 is not restricted as long as the material is a semiconductor material capable of enabling the operation of the HBT structure 2. The sub-collector layer 20 may be formed of at least one of N-type semiconductor materials of GaAs, AlGaAs, InGaP, and InGaAsP; the collector layer 30 may be formed of at least one of semiconductor materials of GaAs, AlGaAs, InGaP, and InGaAsP, the collector layer may be P-type, N-type or undoped, but preferably at least a portion of the collector layer needs to be N-type; the base layer 40 may be formed of at least one of P-type semiconductor materials of GaAs, GaAsSb, InGaAs, and InGaAsN; the second emitter cap layer 64 may be formed of at least one of N-type semiconductor materials of GaAs, AlGaAs, InGaP, and InGaAsP; and the ohmic contact layer 70 may be formed of at least one of N-type semiconductor materials of GaAs and InGaAs.

Wherein the bandgap of the first emitter cap layer 62 can be changed by the composition change. The bandgap of first emitter cap layer 62 comprises at least one of a gradually-increasing bandgap and a constant bandgap in the direction from the second emitter cap layer 64 to the emitter layer 50. The bandgap of the bandgap graded of the first emitter cap layer 62 may start from the bandgap of the second emitter cap layer 64, but is not limited thereto. Thus, conduction band discontinuity between the second emitter layer 64 and emitter layer 50 can be reduced or eliminated. When the emitter-base junction of the HBT is under forward bias, electron barrier between the second emitter cap layer 64 and the emitter layer 50 can also be reduced or eliminated. Therefore, the HBT RF characteristics and ruggedness can be improved.

Specifically, in an embodiment of the invention, the first emitter cap layer 62 comprises at least a graded layer. The graded layer is preferably formed of at least one of undoped or N-type semiconductor materials of AlGaAs, AlGaAsN, AlGaAsP, AlGaAsSb, and InAlGaAs in which Al composition is graded, and the Al composition gradually increases along a direction from the second emitter cap layer 64 to the emitter layer 50. When the amount of the Al composition is higher, the bandgap of the first emitter cap layer 62 is larger, so that the bandgap of the first emitter cap layer 62 gradually increases along the direction from the second emitter cap layer 64 to the emitter layer 50. Then, when the first emitter cap layer 62 comprises a bandgap with linear grade, as shown in FIG. 4a, the bandgap of the first emitter cap layer 62 shows a linear change between the second emitter cap layer 64 and the emitter layer 50, so when electrons flow from the second emitter cap layer 64 to the emitter layer 50 as the emitter-base junction is forwardly biased, the conduction band barrier is reduced, thus effectively reducing the emitter resistance.

Figure 4A:
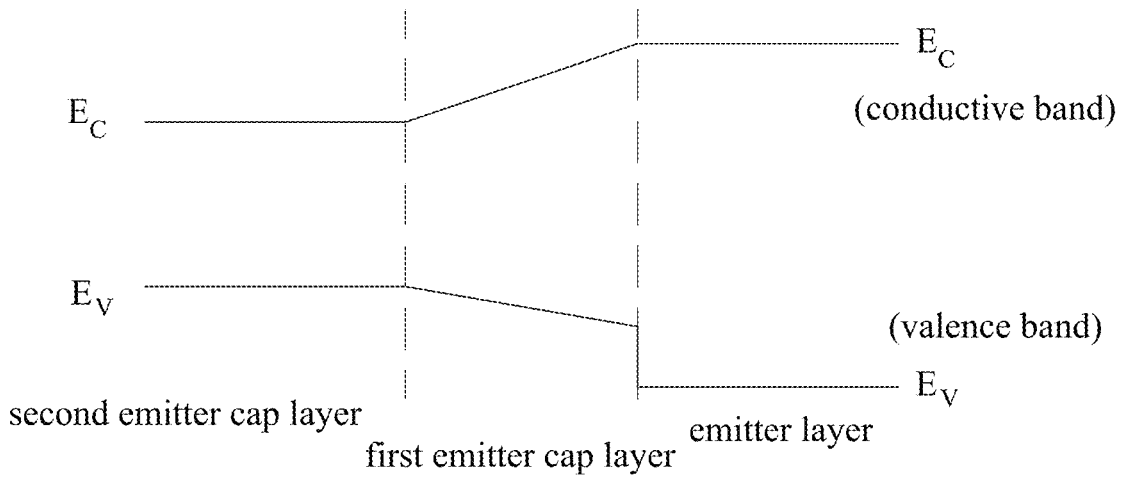
FIGS. 4a-4c show schematic views of the energy band diagram between the emitter cap layer and the emitter layer in the HBT structure of the present invention.

Although FIG. 4a shows an embodiment wherein the bandgap of the first emitter cap layer is linearly graded, the bandgap of the graded layer can also be a non-linear grade by composition change, so as to effectively reduce the emitter resistance. The result is shown in FIG. 4b.

Alternatively, the first emitter cap layer 62 may be a graded layer of two or more layers. FIG. 4c shows an embodiment that the first emitter cap layer 62 comprises a bandgap with linear and non-linear graded layers, but not limited to the above embodiment. Other embodiments may comprise a plurality of layers with linear or non-linear bandgap grade layers, or a combination a plurality of linear and non-linear bandgap grade layers.

Figure 4B:
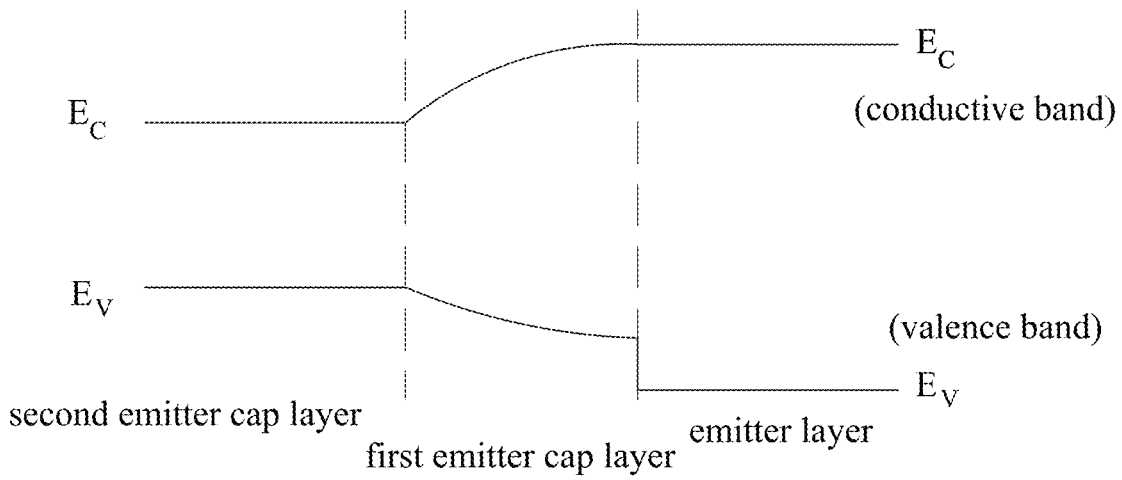
Figure 4C:
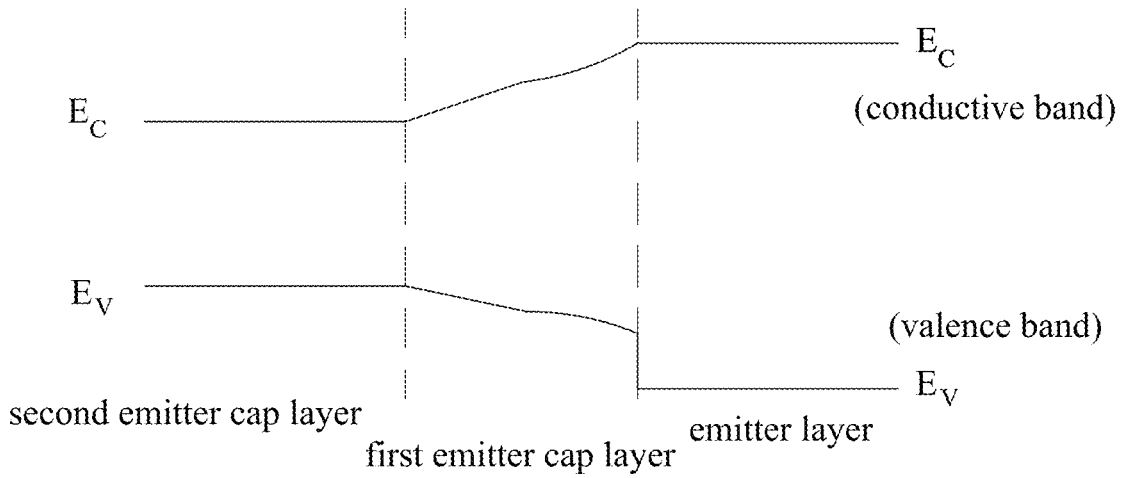

In addition, although FIGS. 4a-4c show only the embodiment wherein there is no conduction band offset between the first emitter cap layer 62 and the emitter layer 50, the conduction band alignment between the first emitter cap 62 and emitter 50 can be Type I or Type II by adjusting composition of the first emitter cap layer, where the Type I band alignment indicates the energy level of conduction band of the first emitter cap 62 is lower than that of emitter layer 50 and the Type II band alignment indicates the energy level of conduction band of the first emitter cap 62 is higher than that of emitter layer 50. Furthermore, the composition of group III and group V in the first emitter cap layer 62 will be defined as follows: Taking $Al_xGa_{1-x}As_{1-z}P_z$ as an example, x represents the mole fraction of Al in group III element of $Al_xGa_{1-x}As_{1-z}P_z$ and z represents the mole fraction of P in group V element of $Al_xGa_{1-x}As_{1-z}P_z$ under the condition of total moles of group III is equal to total moles of group V. Regarding the composition of Al in the first emitter cap layer 62, "the highest value of x is between $0.05 \leq x \leq 0.4$" means that the material used as the first emitter cap layer 62 contains Al element and highest Al mole fraction used in the first emitter cap 62 is in the range of 0.05 to 0.4. When the highest Al composition x in the first emitter cap layer 62 is $\geq 0.05$, the electron potential barrier between the first emitter cap layer 62 and the emitter layer 50 can be reduced or eliminated compared with the conventional GaAs emitter cap layer. When the highest Al composition is at $x \leq 0.4$, the risk of HBT reliability issue caused by the excess of the Al may be avoided or reduced.

Figure 5A:
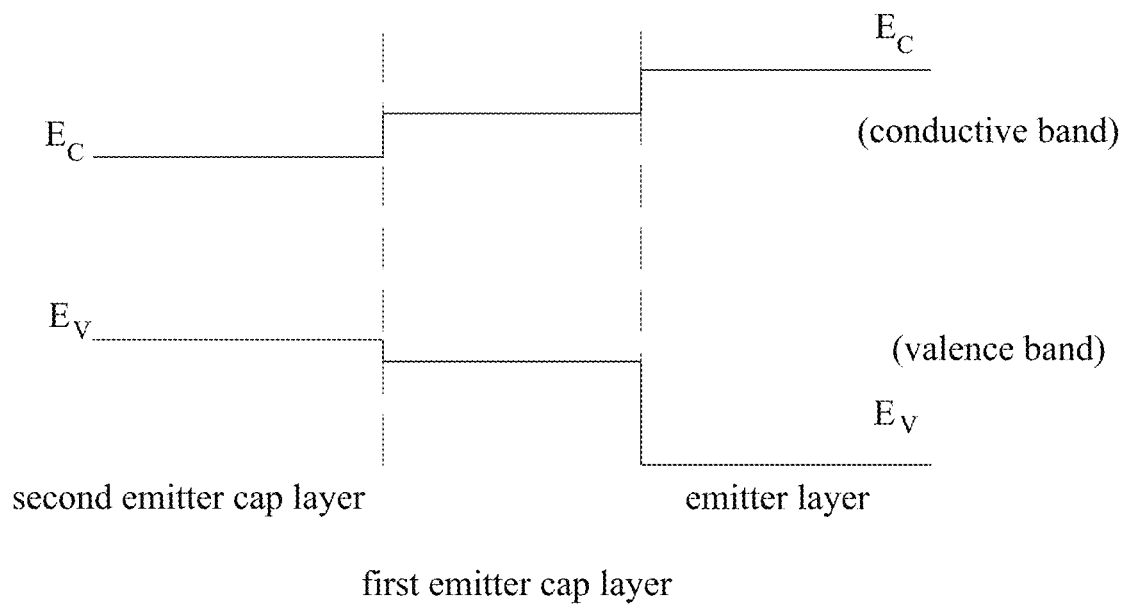
FIGS. 5a-5b show schematic views of the energy band diagram between the emitter cap layer and the emitter layer in the HBT structure of the present invention.

In an embodiment of the invention, the first emitter cap layer 62 may comprise at least a uniform layer with constant bandgap material, and is formed of at least one of the undoped or N-type semiconductor materials of AlGaAs, AlGaAsN, AlGaAsP, AlGaAsSb, and InAlGaAs. When the first emitter cap layer 62 is a uniform layer with constant bandgap, shown in FIG. 5a, since the bandgap of the first emitter cap layer 62 is constant, and its energy level of the conduction band is between the conduction band of the second emitter cap layer 64 and the conduction band of the emitter layer 50. FIG. 5a also shows that the conduction band of the first emitter cap layer 62 is step-like grade, so that each time the electrons pass, the conduction band barrier needs to be overcome is relatively small, and the emitter resistance between the second emitter cap layer 64 and the emitter layer 50 can be reduced.

Figure 5B:
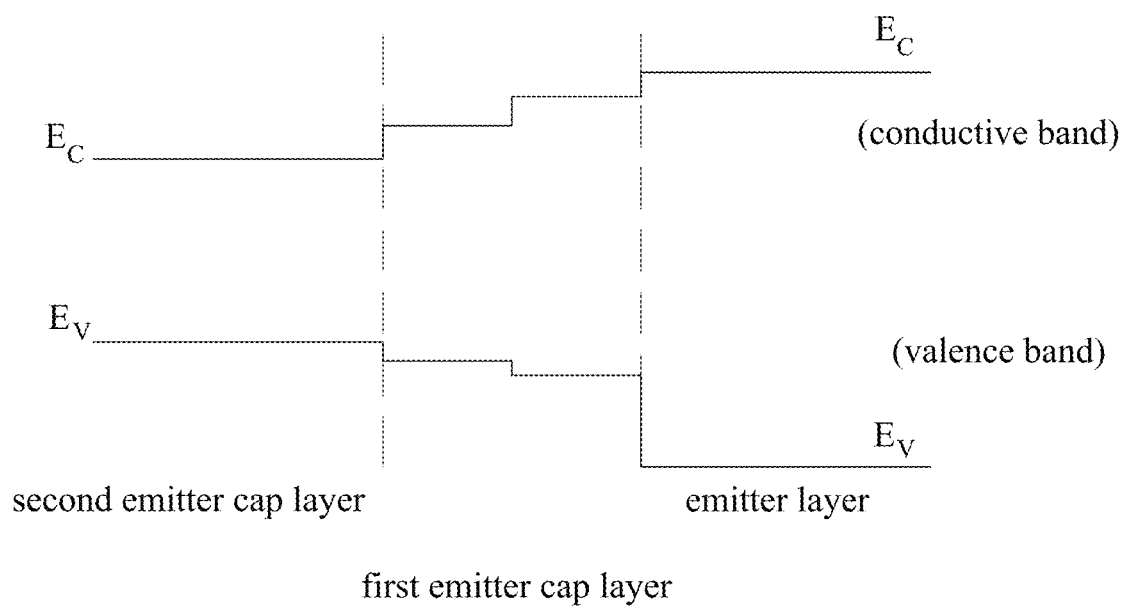

In addition, the first emitter cap layer 62 may be two or more uniform layers, and FIG. 5b shows an embodiment wherein the first emitter cap layer 62 comprises two uniform layers. By changing the composition (for example, by increasing Al content), the energy level of the conduction band of the uniform layer is increased layer by layer, so that each of the conduction band barriers between the second emitter cap layer 64 and the emitter layer 50 is relatively smaller, and thus the emitter resistance between the second emitter cap layer 64 and the emitter layer 50 can be reduced.

In addition, although FIG. 5a and FIG. 5b only show an embodiment wherein the conduction band of the first emitter cap layer 62 is lower than the conduction band of the emitter layer 50, it is also possible to adjust the Al or other compositions to make the conduction band of the first emitter cap layer 62 is of the same height as the conduction band of the emitter layer 50, or the conduction band of the first emitter cap layer 62 is higher than the conduction band of the emitter layer 50.

Figure 6A:
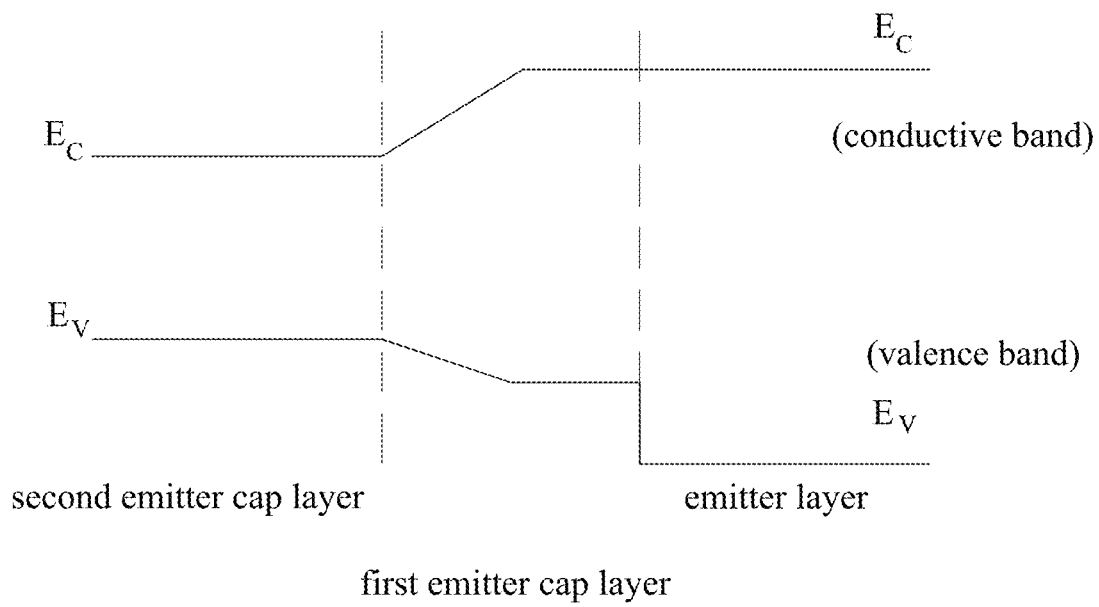
FIGS. 6a-6b show schematic views of the energy band diagram between the emitter cap layer and the emitter layer in the HBT structure of the present invention.
Figure 6B:
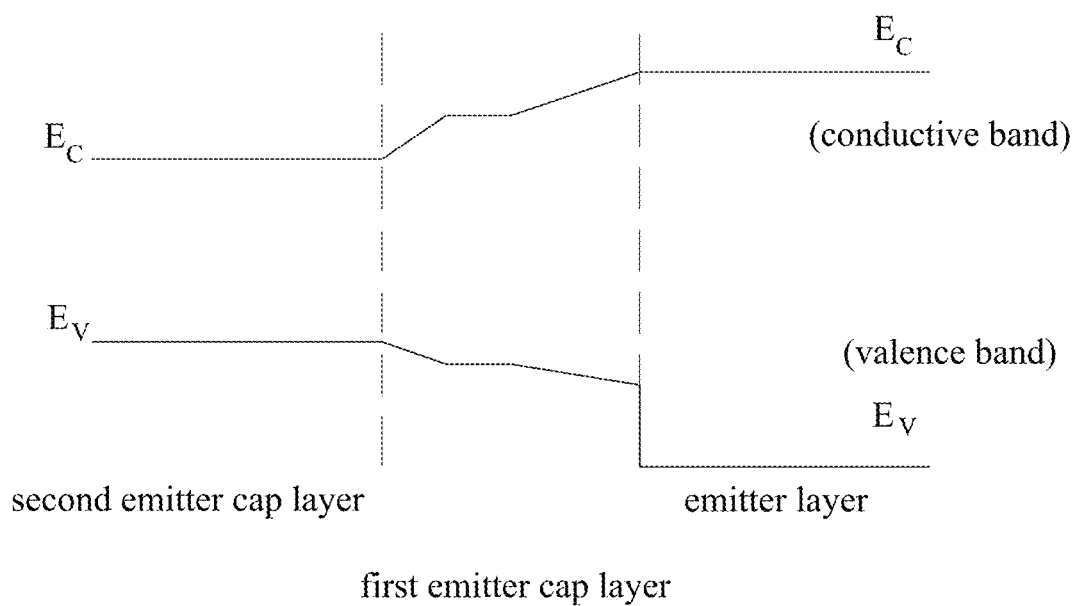

In an embodiment of the invention, the first emitter cap layer 62 may comprise a combination of at least a uniform layer and at least a graded layer, wherein the uniform layer is formed of at least one of undoped or N-type semiconductor materials of AlGaAs, AlGaAsN, AlGaAsP, AlGaAsSb and InAlGaAs; and the graded layer is formed of at least one of undoped or N-type semiconductor materials of AlGaAs, AlGaAsN, AlGaAsP, AlGaAsSb, and InAlGaAs, with composition grade. Also, in the direction from the second emitter cap layer 64 to the emitter layer 50, the bandgap of the graded layer gradually increases. As shown in FIG. 6a, in the direction from the second emitter cap layer 64 to the emitter layer 50, when the first emitter cap layer 62 sequentially comprises a graded layer with linear bandgap grade and a uniform layer, the energy level of the conduction band between the second emitter cap layer 64 and the emitter layer 50 is first linearly increased and then keeps constant. Moreover, as shown in FIG. 6b, when the first emitter cap layer 62 sequentially comprises a graded layer with linear bandgap grade, a uniform layer, and a graded layer with linear bandgap grade, the energy level of the conduction band between the second emitter cap layer 64 and the emitter layer 50 is first linearly increased, then keeps constant, and then finally increases linearly, wherein the slopes of the linear grade of the two graded layers may be the same or different. In addition, the combination of at least a uniform layer and at least a graded layer is not limited thereto, and may be alternately stacked by a plurality of uniform layers and a plurality of graded layers to form an embodiment having a plurality of constant bandgaps and graded bandgaps.

According to the above description, through adjusting the semiconductor material composition, the bandgap grade of the first emitter cap layer 62 may start from the bandgap of the second emitter cap layer 64, but is not limited thereto, and the bandgap grade may be at least one of linear, non-linear, and step-like, or a combination thereof. Wherein, the bandgap of the first emitter cap layer 62 may comprise at least one or more constant bandgaps before, during or after the gradually-increasing bandgap.

Considering the trade-off of the difficulty in manufacturing, the ruggedness improvement, and the emitter resistance, the first emitter cap layer 62 has a thickness of 1 nm to 300 nm, preferably 10 nm to 200 nm, and optimally 20 nm to 100 nm; and considering the trade-off of the breakdown voltage and the emitter-base junction capacitance, the first emitter cap layer 62 has an N-type doping concentration of $1\times10^{16}/cm^3$ to $5\times10^{18}/cm^3$, preferably $1\times10^{17}/cm^3$ to $4\times10^{18}/cm^3$, optimally, $3\times10^{17}/cm^3$ to $3\times10^{18}/cm^3$.

According to an embodiment of the invention, through adjusting the semiconductor material composition (e.g., Al composition), the first emitter cap layer 62 may reduce or eliminate (especially the Type II band alignment) the conduction band barrier encountered by the electrons passing from the first emitter cap layer 62 to the emitter layer 50, to reduce the emitter resistance (Re). Therefore, the first emitter cap layer 62 does not need to be a heavily doped N-type semiconductors, so that the emitter-base junction breakdown voltage can be greatly increased without increasing the emitter resistance, and the junction capacitance of the emitter-base junction can be greatly reduced to improve the high frequency response characteristics and ruggedness of the HBT at the same time. Furthermore, since the bandgap of the emitter cap formed of Al-containing semiconductor material generally has a wider bandgap than the conventional GaAs emitter cap layer, the emitter cap layer with wider bandgap can also have higher breakdown voltage of the emitter-base junction and improve the HBT ruggedness. Compared with GaAs as an emitter cap layer, since the first emitter cap layer 62 mainly containing AlGaAs material, the AlGaAs has a property of higher thermal coefficient of resistance than that of GaAs. When the HBT is operated at a very high power density, the junction temperature will be increased. The resistance of the first emitter cap layer 62 containing AlGaAs material or the like will rapidly increase and improve the HBT ruggedness. While the HBT under a normal operating power density, the first emitter cap layer 62 containing a material such as AlGaAs does not significantly increase the emitter resistance for the above reasons, so the high frequency response characteristics of HBT PA do not suffer.

In addition, the material InGaP, InGaAsP or InAlGaP of the emitter layer 50 may have atomic ordering effect, which may cause spontaneous polarization, and the higher ordering, the larger spontaneous polarization, resulting in a smaller bandgap of the material and a stronger electric field inside the materials. The stronger electric field will deplete more carriers of the first emitter cap layer 62 on the emitter layer 50, causing an increase in the emitter resistance and affects the RF characteristics of the PA. Therefore, by using a lower ordering InGaP, InGaAsP and InAlGaP emitter layers 50, the carrier depletion of the first emitter cap layer 62 can be reduced, and the negative impact of emitter resistance on the PA characteristics or the design complexity of the first emitter cap layer 62 can be avoided.

Therefore, in an embodiment of the present invention, to determine the atomic ordering effect in the emitter layer 50, the photoluminescence (PL) spectroscopy is used for evaluation. In this method, first, the material of the emitter layer 50 with a thickness of several hundred nanometers is epitaxially grown on a substrate by the same growth condition as the emitter layer 50. When the emitter layer material is with higher ordering, its bandgap is relatively lower, so the PL peak wavelength of the emitter material is relatively longer compared with lower ordering emitter materials when PL measurement is performed.

Figure 7:
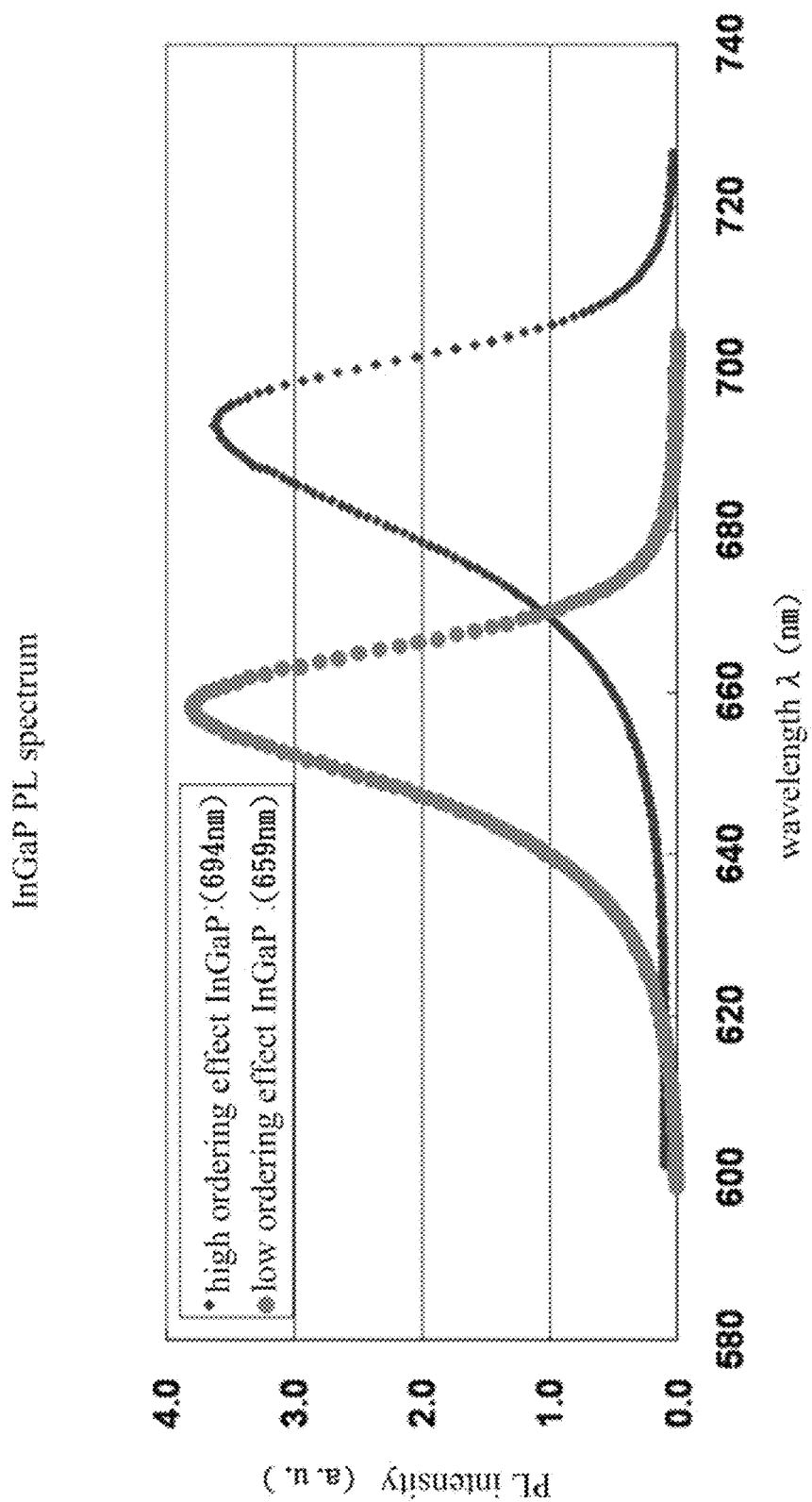
FIG. 7 shows a photoluminescence (PL) spectrum of indium gallium phosphide (InGaP) as the emitter material in the present invention.

FIG. 7 is a PL spectrum of InGaP measured by photoluminescence spectroscopy. Wherein, InGaP with higher ordering has a lower bandgap, so the radiated the PL peak wavelength is longer, which is 694 nm, while InGaP with lower ordering has a larger bandgap, so the radiated PL peak wavelength is shorter, which is 659 nm. In general, in the case of low ordering emitter materials, the InGaP PL peak wavelength can be as short as 640 nm, the radiated PL peak wavelength of InGaAsP can be as short as 645 nm, and the PL peak wavelength of InAlGaP can be as short as 635 nm. To avoid strong electric field generated by high ordering effect, the PL peak wavelength of the emitter layer 50 formed of InGaP may be 694 nm or less, preferably 685 nm or less, and optimally 675 nm or less. Similarly, the InGaAsP forming the emitter layer 50 may have PL peak wavelength of 710 nm or less, preferably 695 nm or less, and optimally 685 nm or less. The InAlGaP forming the emitter layer 50 may have PL peak wavelength of 685 nm or less, preferably 675 nm or less, and optimally 665 nm or less.

Figure 8:
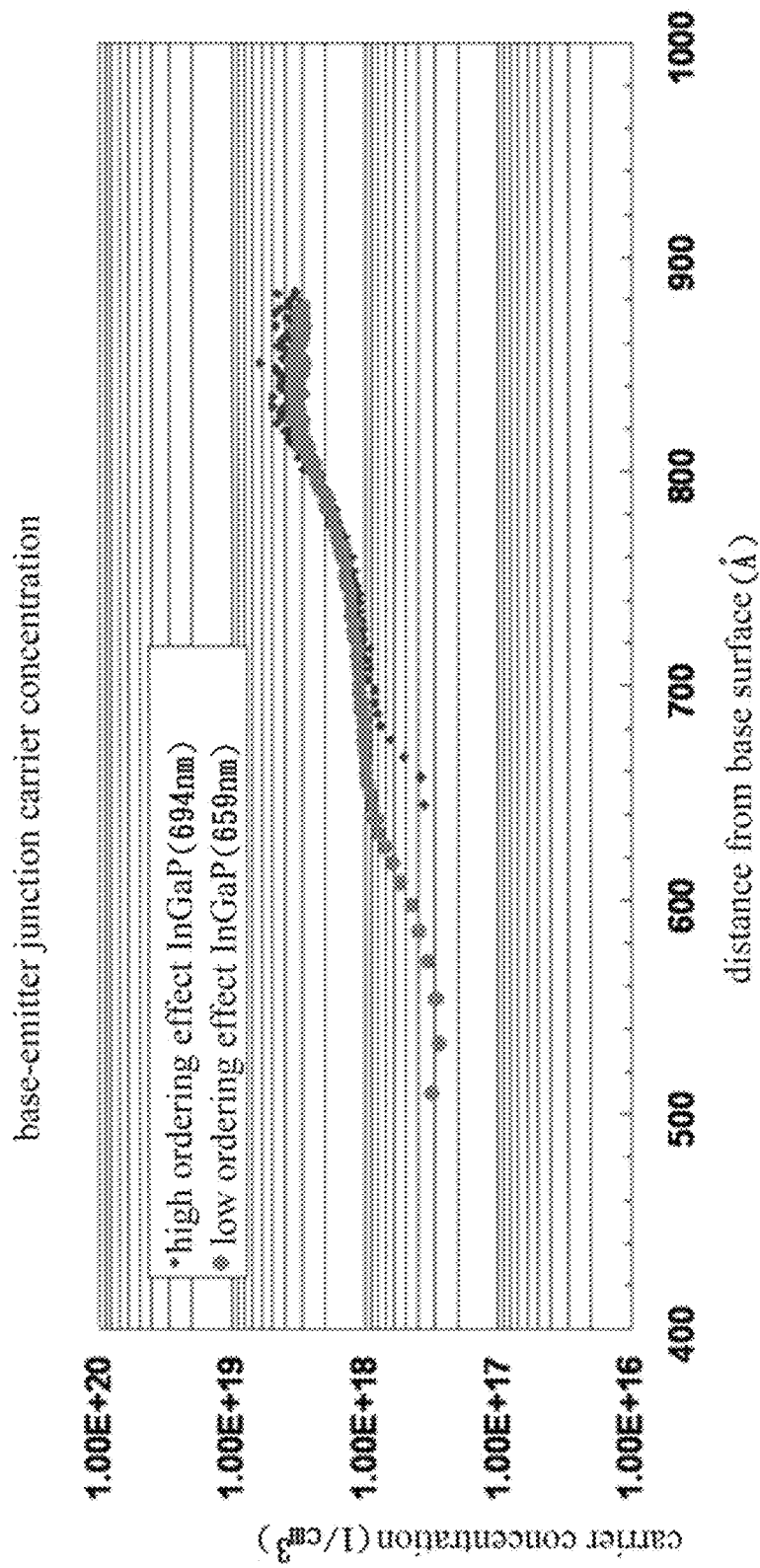
FIG. 8 shows the carrier concentration profile of the emitter-base junction measured by C-V measurement with different orderness of indium gallium phosphide emitter.

FIG. 8 is an experiment result of carrier concentration profiles of emitter-base junction obtained by CV measurement using InGaP emitter with different ordering effects. Both of the InGaP emitters in FIG. 8 have the same doping concentration and both of the first emitter cap layers also have the same doping concentration. The base layer is P-type GaAs, the thickness is 80 nm, the carrier concentration is $4 \times 10^{19}/cm^3$, and the emitter layer is InGaP with different ordering effect, and the thickness is 40 nm.

The first emitter cap layer is formed of $Al_{0.15}Ga_{0.85}As$ with a thickness of 6 nm and an $Al_xGa_{1-x}As$ bandgap grade layer with a thickness of 30 nm (the value of x is gradually changed from 0.15 to 0) sequentially stacked on the InGaP emitter layer. As shown in FIG. 8, the InGaP emitter layer with a higher ordering effect forms a stronger electric field due to a larger spontaneous polarization, resulting in more depletion of the first emitter cap carrier. The depletion of the carrier will cause an increase in the emitter resistance. To reduce the depletion of the first emitter cap carrier, it is necessary to increase the N-type doping concentration in the first emitter cap layer, which however will cause the emitter-base junction breakdown voltage drop and the emitter-base junction capacitance increase, resulting in negative impact on the ruggedness and high frequency response characteristics of HBT PA. As shown in FIG. 8 the emitter-base junction carrier concentration profile of the InGaP emitter layer with lower ordering effect due to less spontaneous polarization effect, the first emitter cap carrier is less depleted and therefore the negative impact on Re is insignificant.

Furthermore, in an embodiment of the invention, the high ruggedness HBT structure 2 may further comprise an intermediate composite layer 15 formed between the substrate 10 and the sub-collector layer 20 and formed of a semiconductor material.

Preferably, the intermediate composite layer 15 may comprise at least a buffer layer, and the buffer layer is formed of a III-V semiconductor material.

Preferably, the intermediate composite layer 15 may comprise a field effect transistor.

Preferably, the intermediate composite layer 15 comprises a pseudomorphic high electron mobility transistor, which is sequentially stacked on the substrate, comprising: at least a buffer layer, a first donor layer, a first spacer layer, a channel layer, a second spacer layer, a second donor layer, a Schottky layer, an etch stop layer, and a cap layer for ohmic contact; the buffer layer is formed of a III-V semiconductor material, the first donor layer and the second donor layer are formed of at least one of N-type semiconductor materials of GaAs, AlGaAs, InAlGaP, InGaP, and InGaAsP, the first spacer layer and the second spacer layer are formed of at least one of semiconductor materials of GaAs, AlGaAs, InAlGaP, InGaP, and InGaAsP, the channel layer is formed of at least one of semiconductor materials of GaAs, InGaAs, AlGaAs, InAlGaP, InGaP, and InGaAsP, the Schottky layer is formed of at least one of semiconductor materials of GaAs, AlGaAs, InAlGaP, InGaP, and InGaAsP, the etch stop layer is formed of at least one of semiconductor materials of GaAs, AlGaAs, InAlGaP, InGaAsP, InGaP, and AlAs, and the cap layer is formed of an N-type III-V semiconductor material.

Furthermore, in an embodiment of the present invention, the high ruggedness HBT structure 2 may further comprise a spacer layer 55 formed between the first emitter cap layer 62 and the emitter layer 50 and formed of an N-type or undoped III-V semiconductor material. The use of the spacer layer 55 can be exemplified by, but not limited to, adjusting the bandgap profile, reducing the manufacturing difficulty, improving the process yield, using as an etch stop layer or end point detection of the etching process, and the spacer layer 55 can also be as a quantum well. Preferably, the spacer layer 55 has a thickness of 0.2 nm to 200 nm and an N-type doping concentration of $1 \times 10^{16}/cm^3$ to $5 \times 10^{18}/cm^3$, preferably $1 \times 10^{17}/cm^3$ to $4 \times 10^{18}/cm^3$, and optimally $3 \times 10^{17}/cm^3$ to $3 \times 10^{18}/cm^3$.

The material of the spacer layer 55 is not limited as long as it is a known N-type or undoped III-V semiconductor material, but preferably may be formed of at least one of N-type or undoped semiconductor materials of AlGaAs, AlGaAsN, AlGaAsP, AlGaAsSb, InAlGaAs, InGaP, InGaAsP, InAlGaP, and GaAs.

Preferably, the bandgap of the spacer layer 55 may be changed by the change of the composition in the semiconductor material, so that the spacer layer 55 may comprise at least one of gradually-increasing bandgap or gradually-decreasing bandgap in the direction from the first emitter cap layer 62 to the emitter layer 50. However, the spacer layer 55 is not limited to a graded layer of compositional change, but may also be a uniform layer such that the spacer layer 55 behaves as a constant bandgap. The spacer layer 55 may also be a combination of a graded layer and a uniform layer, such that the bandgap change of the spacer layer 55 in the direction from the first emitter cap layer 62 to the emitter layer 50 may comprise at least one of gradually-increasing bandgap, constant bandgap and gradually-decreasing bandgap. Similarly, the bandgap grade may further comprise at least one of linear grade, nonlinear grade, and step-like grade.

For example, in the case where the conduction band of the first emitter cap layer 62 is lower than the conduction band of the emitter layer 50 (Type I), a spacer layer 55 containing at least a gradually-increasing bandgap may be used to reduce or eliminate the electron barrier between the first emitter cap layer 62 and the emitter layer 50. In addition, when the spacer layer 55 with the graded bandgap is introduced, resulting in the conduction band of the spacer layer 55 higher than the conduction band of the emitter layer 50 (Type II), since the electrons do not encounter the barrier between the spacer layer 55 and the emitter layer 50, there is no impact on the emitter resistance.

In the case where the conduction band of the first emitter cap layer 62 is higher than the conduction band of the emitter layer 50 (Type II), if a spacer layer 55 containing at least a gradually-decreasing bandgap is used as the etching stop layer or the like, the energy level of conduction band of the spacer layer 55 can be equal to the energy level of conduction band of the emitter layer 50. Furthermore, after the spacer layer 55 is added, the energy level of conduction band of the spacer layer 55 may be lower than that of the emitter layer 50 and the electron barrier may be formed between the spacer layer 55 and the emitter layer 50. However, since the spacer layer 55 can be served as a quantum well, the electron energy level of the spacer layer 55 is quantized, with the result that the energy level of the spacer layer 55 is increased. When the electrons pass between the spacer layer 55 and the emitter layer 50, the electron barrier becomes low, so that the emitter resistance does not increase significantly. In addition, in consideration of the process, a spacer layer 55 having at least a gradually-increasing bandgap is introduced so that the conduction band of the spacer layer 55 is much higher than the conduction band of the emitter layer 50. In this case, there is no impact on emitter resistance.

In addition, the above description is to make those skilled in the art understand that when the spacer layer 55 is used to improve the process, no matter what the bandgap is, (i.e., the bandgap is at least one of gradually-increasing, constant or gradually-decreasing bandgap) the spacer layer 55 does not substantially cause a significant increase in the emitter resistance, and is not intended to limit the bandgap engineering of the spacer layer 55 to the above example.

Through the description of the above embodiments, the present invention provides a high ruggedness HBT structure, by the Al-containing first emitter cap layer, in addition to effectively increasing the breakdown voltage of the emitter-base junction and reducing the emitter-base junction capacitance without increasing or slightly increasing the emitter resistance. Also, the invention utilizes the characteristics of the AlGaAs-containing material having a wider bandgap and higher thermal coefficient of resistance, thereby increasing the ruggedness and RF characteristics of the power amplifier at high power density operation. The invention can improve the overall efficiency of the PA by changing the HBT design, such as reducing Re, to trade-off some of the increased PA ruggedness in exchange for further improving the efficiency and linearity of the PA and the flexibility of the design.

In addition, to avoid a high emitter resistance due to strong spontaneous polarization of the emitter layer material, the PL method is used to evaluate the ordering effect of the emitter layer material, thereby enabling the determination and appropriate application of a lower ordering effect emitter layer formed of InGaP, InGaAsP, InAlGaP, thus reducing the carrier depletion in the first emitter cap layer, avoiding the negative impact on the PA performance, or avoiding the design complexity of the first emitter cap layer, and further enhancing the overall electrical characteristics and ruggedness of the HBT and PA.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:
1. A high ruggedness heterojunction bipolar transistor structure, comprising:
 a sub-collector layer stacked on a substrate and formed of an N-type III-V semiconductor material;
 a collector layer stacked on the sub-collector layer and formed of a III-V semiconductor material;
 a base layer stacked on the collector layer and formed of a P-type III-V semiconductor material;
 an emitter layer stacked on the base layer and formed of at least one of N-type semiconductor materials of InGaP, InGaAsP and InAlGaP;
 a first emitter cap layer stacked on the emitter layer and formed of at least one of undoped or N-type semiconductor materials of $Al_xGa_{1-x}As$, $Al_xGa_{1-x}As_{1-y}N_y$, $Al_xGa_{1-x}As_{1-z}P_z$, $Al_xGa_{1-x}As_{1-w}Sb_w$, and $In_rAl_xGa_{1-x-r}As$, x having a highest value between $0.05 \leq x \leq 0.4$, and y, z, r, w $\leq 0.1$;
 a second emitter cap layer stacked on the first emitter cap layer and formed of an N-type III-V semiconductor material; and
 an ohmic contact layer stacked on the second emitter cap layer and formed of an N-type III-V semiconductor material,
 wherein in a direction from the second emitter cap layer to the emitter layer, the bandgap of the first emitter cap layer comprising at least one of gradually-increasing bandgap and constant bandgap, and
 wherein by photoluminescence spectrum of emitter material, the photoluminescence peak wavelength of InGaP is 694 nm or less, and the photoluminescence peak wavelength of InGaAsP is 710 nm or less, and the photoluminescence peak wavelength of InAlGaP is 685 nm or less.

2. The high ruggedness heterojunction bipolar transistor structure as claimed in claim 1, wherein the first emitter cap layer comprises at least a uniform layer with constant gap.

3. The high ruggedness heterojunction bipolar transistor structure as claimed in claim 1, wherein the first emitter cap layer comprises at least a graded layer, and in the direction from the second emitter cap layer to the emitter layer, bandgap of the graded layer is gradually increasing.

4. The high ruggedness heterojunction bipolar transistor structure as claimed in claim 1, wherein the first emitter cap layer comprises at least a combination of a uniform layer and a graded layer, and in the direction from the second emitter cap layer to the emitter layer, bandgap of the graded layer is gradually increasing.

5. The high ruggedness heterojunction bipolar transistor structure as claimed in claim 1, wherein the first emitter cap layer has a thickness of 1 nm to 300 nm and an N-type doping concentration of $1 \times 10^{16}/cm^3$ to $5 \times 10^{18}/cm^3$.

6. The high ruggedness heterojunction bipolar transistor structure as claimed in claim 1, wherein by photoluminescence spectrum of emitter material, the photoluminescence peak wavelength of InGaP is 685 nm or less, and the photoluminescence peak wavelength of InGaAsP is 695 nm or less, and the photoluminescence peak wavelength of InAlGaP is 675 nm or less.

7. The high ruggedness heterojunction bipolar transistor structure as claimed in claim 1, wherein by photoluminescence spectrum of emitter material, the photoluminescence peak wavelength of InGaP is 675 nm or less, and the photoluminescence peak wavelength of InGaAsP is 685 nm or less, and the photoluminescence peak wavelength of InAlGaP is 665 nm or less.

8. The high ruggedness heterojunction bipolar transistor structure as claimed in claim 1, wherein an intermediate composite layer is formed between the substrate and the sub-collector layer and formed of a semiconductor material.

9. The high ruggedness heterojunction bipolar transistor structure as claimed in claim 8, wherein the intermediate composite layer comprises at least a buffer layer, and the buffer layer is formed of a III-V semiconductor material.

10. The high ruggedness heterojunction bipolar transistor structure as claimed in claim 8, wherein the intermediate composite layer comprises a field effect transistor.

11. The high ruggedness heterojunction bipolar transistor structure as claimed in claim 1, wherein a spacer layer is formed between the first emitter cap layer and the emitter layer and formed of an N-type or undoped III-V semiconductor material.

12. The high ruggedness heterojunction bipolar transistor structure as claimed in claim 11, wherein the spacer layer has a thickness of 0.2 nm to 200 nm and an N-type doping concentration of $1 \times 10^{16}/cm^3$ to $5 \times 10^{18}/cm^3$.

13. The high ruggedness heterojunction bipolar transistor structure as claimed in claim 11, wherein the spacer layer is formed of at least one of N-type or undoped semiconductor materials of AlGaAs, AlGaAsN, AlGaAsP, AlGaAsSb, InAlGaAs, InGaP, InGaAsP, InAlGaP, and GaAs.

14. The high ruggedness heterojunction bipolar transistor structure as claimed in claim 11, wherein the bandgap of the spacer layer comprises at least one of gradually-increasing bandgap, constant bandgap and gradually-decreasing bandgap.

15. The high ruggedness heterojunction bipolar transistor structure as claimed in claim 8, wherein the intermediate composite layer comprises a pseudomorphic high electron mobility transistor, which is sequentially stacked on the substrate, comprising: at least a buffer layer, a first donor layer, a first spacer layer, a channel layer, a second spacer layer, a second donor layer, a Schottky layer, an etch stop layer, and a cap layer for ohmic contact;
  the buffer layer is formed of a III-V semiconductor material,
  the first donor layer and the second donor layer are formed of at least one of N-type semiconductor materials of GaAs, AlGaAs, InAlGaP, InGaP, and InGaAsP,
  the first spacer layer and the second spacer layer are formed of at least one of semiconductor materials of GaAs, AlGaAs, InAlGaP, InGaP, and InGaAsP,
  the channel layer is formed of at least one of semiconductor materials of GaAs, InGaAs, AlGaAs, InAlGaP, InGaP, and InGaAsP,
  the Schottky layer is formed of at least one of semiconductor materials of GaAs, AlGaAs, InAlGaP, InGaP, and InGaAsP,
  the etch stop layer is formed of at least one of semiconductor materials of GaAs, AlGaAs, InAlGaP, InGaAsP, InGaP, and AlAs, and
  the cap layer is formed of an N-type III-V semiconductor material.

16. A high ruggedness heterojunction bipolar transistor structure, comprising:
  a sub-collector layer stacked on a substrate and formed of an N-type III-V semiconductor material;
  a collector layer stacked on the sub-collector layer and formed of a III-V semiconductor material;
  a base layer stacked on the collector layer and formed of a P-type III-V semiconductor material;
  an emitter layer stacked on the base layer and formed of at least one of N-type semiconductor materials of InGaP, InGaAsP and InAlGaP;
  a first emitter cap layer stacked on the emitter layer and formed of at least one of undoped or N-type semiconductor materials of $Al_xGa_{1-x}As$, $Al_xGa_{1-x}As_{1-y}N_y$, $Al_xGa_{1-x}As_{1-z}P_z$, $Al_xGa_{1-x}As_{1-w}Sb_w$, and $In_rAl_xGa_{1-x-r}As$, x having a highest value between 0.05≤x≤0.4, and y, z, r, w≤0.1;
  a second emitter cap layer stacked on the first emitter cap layer and formed of an N-type III-V semiconductor material; and
  an ohmic contact layer stacked on the second emitter cap layer and formed of an N-type III-V semiconductor material;
  wherein in a direction from the second emitter cap layer to the emitter layer, the bandgap of the first emitter cap layer comprising at least one of gradually-increasing bandgap and constant bandgap, and
  wherein the first emitter cap layer comprises at least a combination of a uniform layer and a graded layer, and in the direction from the second emitter cap layer to the emitter layer, bandgap of the graded layer is gradually increasing.

17. The high ruggedness heterojunction bipolar transistor structure as claimed in claim 16, wherein by photoluminescence spectrum of emitter material, the photoluminescence peak wavelength of InGaP is 694 nm or less, and the photoluminescence peak wavelength of InGaAsP is 710 nm or less, and the photoluminescence peak wavelength of InAlGaP is 685 nm or less.

18. A high ruggedness heterojunction bipolar transistor structure, comprising:
  a sub-collector layer stacked on a substrate and formed of an N-type III-V semiconductor material;
  a collector layer stacked on the sub-collector layer and formed of a III-V semiconductor material;
  a base layer stacked on the collector layer and formed of a P-type III-V semiconductor material;
  an emitter layer stacked on the base layer and formed of at least one of N-type semiconductor materials of InGaP, InGaAsP and InAlGaP;
  a first emitter cap layer stacked on the emitter layer and formed of at least one of undoped or N-type semiconductor materials of $Al_xGa_{1-x}As$, $Al_xGa_{1-x}As_{1-y}N_y$, $Al_xGa_{1-x}As_{1-z}P_z$, $Al_xGa_{1-x}As_{1-w}Sb_w$, and $In_rAl_xGa_{1-x-r}As$, x having a highest value between 0.05≤x≤0.4, and y, z, r, w≤0.1;
  a second emitter cap layer stacked on the first emitter cap layer and formed of an N-type III-V semiconductor material; and
  an ohmic contact layer stacked on the second emitter cap layer and formed of an N-type III-V semiconductor material,
  wherein in a direction from the second emitter cap layer to the emitter layer, the bandgap of the first emitter cap layer comprising at least one of gradually-increasing bandgap and constant bandgap,
  wherein a spacer layer is formed between the first emitter cap layer and the emitter layer and formed of an N-type or undoped III-V semiconductor material, and
  wherein the bandgap of the spacer layer comprises at least one of gradually-increasing bandgap, constant bandgap and gradually-decreasing bandgap.

19. The high ruggedness heterojunction bipolar transistor structure as claimed in claim 18, wherein by photoluminescence spectrum of emitter material, the photoluminescence peak wavelength of InGaP is 694 nm or less, and the photoluminescence peak wavelength of InGaAsP is 710 nm or less, and the photoluminescence peak wavelength of InAlGaP is 685 nm or less.

* * * * *